United States Patent [19]

Kratt, 3rd et al.

[11] 3,854,099

[45] Dec. 10, 1974

[54] WIDEBAND COHERENT FM DETECTOR

[75] Inventors: Edward J. A. Kratt, 3rd, Montville, N. J.; Jacob Klapper, New York, N.Y.

[73] Assignee: RFL Industries Inc., Boonton, N.J.

[22] Filed: Feb. 15, 1973

[21] Appl. No.: 332,600

[52] U.S. Cl. .................. 329/110, 307/229, 328/127

[51] Int. Cl. .............................................. H03d 3/06

[58] Field of Search ............ 329/110, 112, 140–143; 328/127, 128; 307/229

[56] References Cited

UNITED STATES PATENTS

| | | | |
|---|---|---|---|
| 3,054,064 | 9/1962 | Sherman | 329/140 X |
| 3,213,369 | 10/1965 | McAuliffe | 328/127 X |
| 3,252,098 | 5/1966 | Schlaepfer | 328/127 X |
| 3,652,942 | 3/1972 | O'Connor et al. | 328/127 |

*Primary Examiner*—Alfred L. Brody

*Attorney, Agent, or Firm*—Rudolph J. Jurick

[57] ABSTRACT

An FM detector comprising integrators, differentiators, summers and multipliers arranged in two sections. One section functions as a wideband, coherent FM discriminator and the other section functions as a low-delay carrier suppressor. All of the components are compatible with integrated circuit technology.

8 Claims, 27 Drawing Figures

DETECTOR INPUT

OUTPUT OF SUMMER 13

OUTPUT OF MULTIPLIER 15

OUTPUT OF SUMMER 14

OUTPUT OF TRAP 17

WIDEBAND COHERENT FM DETECTOR

BACKGROUND OF THE INVENTION

Prior FM detectors suffer from various shortcomings. The discriminator balance is made at baseband, which sets a lower limit for the discriminator sensitivity due to the difficulty of amplifying small d.c. signals. Also, when RF is attenuated by a lowpass filter, a considerable time delay is introduced into the system. Furthermore, all FM discriminators exhibit what is known as a threshold effect which limits the noise immunity of FM. All currently known threshold reducing arrangements result in bandwidth or stability limitations.

A wideband coherent FM detector made as described hereinbelow has (a) extreme wideband capability with excellent sensitivity, (b) near zero delay, (c) improved interference immunity for high interference conditions, (d) capability of RF interference cancellation and (e) compatibility with integrated circuit technology.

SUMMARY OF THE INVENTION

In one embodiment of the invention, an integrator, differentiator, summer and multiplier are connected to form a section which functions as a wideband coherent FM discriminator. A second section comprises an integrator, multiplier and summer connected to function as a low delay, carrier suppressor. In a second embodiment of the invention, the integrator of the discriminator is replaced by a second differentiator with appropriate modification of the circuitry. The second embodiment of the invention may further be modified by replacing the two differentiators by two integrators. All embodiments of the invention may be provided with means for cancelling out the undesirable effects of voltage components which are in phase guadrature with the desired output, which components arise by reason of imperfections in practical integrators and differentiators.

An object of this invention is the provision of an improved FM detector.

An object of this invention is the provision of an FM detector comprising a wideband coherent FM discriminator and a low-delay carrier suppressor.

An object of this invention is the provision of a wideband coherent FM detector comprising conventional components all of which are compatible with integrated circuit technology.

An object of this invention is the provision of an FM detector having extreme wideband capability with excellent sensitivity.

An object of this invention is the provision of an FM detector having improved immunity for high interference conditions, and/or RF interference cancellation.

An object of this invention is the provision of an FM detector having an extremely low delay.

An object of this invention is the provision of an FM detector comprising various combinations of integrators and differentiators and which includes means for cancelling out the components which are in phase quadrature with the desired output signal and which arise by reason of imperfections in practical integrators and differentiators.

An object of this invention is the provision of an FM detector in which the discriminator has a very low threshold effect without sacrifice of bandwidth or operating stability.

An object of this invention is the provision of an FM detector having a discriminator which does not produce unwanted components at the center freqeuncy or baseband, which components may arise when a rapid change occurs in the input frequency to an integrator.

The above-stated and other objects and advantages of the invention will become apparent from the following description taken with the accompanying drawings illustrating several embodiments of the invention. It will be understood, however, that the drawings are for purposes of illustration and are not to be construed as defining the scope or limits of the invention, reference being had for the latter purpose to the claims appended hereto.

BRIEF DESCRIPTION OF THE DRAWINGS

In the drawings wherein like reference characters denote like parts in the several views.

DESCRIPTION OF PREFERRED EMBODIMENTS

Figure 1:
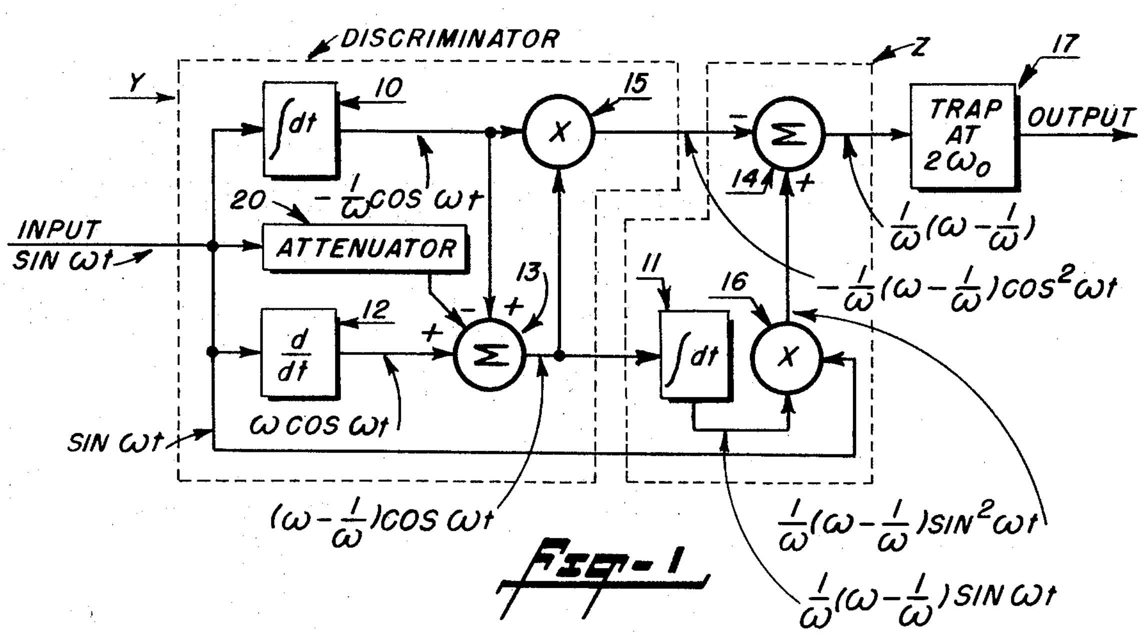
FIG. 1 is a block diagram of a wideband coherent FM detector made in accordance with one embodiment of this invention.

Reference now is made to FIG. 1 wherein the wideband coherent detector comprises two integrators 10 and 11, a differentiator 12, two summers 13 and 14, and two multipliers 15 and 16, all compatible with integrated circuit technology. The discriminator portion of the circuit, enclosed within the broken lines identified by the reference letter Y, comprises the integrator 10, differentiator 12, summer 13 and multiplier 15, with the input wave fed simultaneously to the integrator and the differentiator. Ideally, the output of the integrator 10 lags the input wave by 90° and its amplitude varies inversely with frequency, whereas, the output of the differentiator 12 leads the input wave by 90° and its amplitude is directly proportional to frequency. Thus, ideally, the outputs of the integrator 10 and differentiator 12 are always 180° out of phase and their sum can be made to vanish at some frequency $w_o$. Above and below $w_o$ the output of the summer 13 has an increasing amplitude. There is, however, a phase reversal when the wave goes through $w_o$ because below $w_o$ the integrator output dominates, while above $w_o$ the differentiator output dominates. Consequently, the wave lends itself to coherent amplitude detection which function is performed by the multiplier 15. One input of this multiplier receives the output of the summer 13 while the other input receives the output of the integrator 10. The output of this multiplier is a wave containing the demodulated output and a carrier of twice the initial frequency.

On a steady-state frequency offset basis, and neglecting phase inversions in practical integrators, differentiators and summers, the pertinent wave equations are marked on the drawing. An input of sin wt is assumed where the frequency is normalized with respect to the center frequency, i.e. $w_o = 1$. The demodulated output of the multiplier 15 is proportional to $1/w\ (w - 1/w)$, the parenthesized expression $(w - 1/w)$ being arithmetically symmetrical over a considerable region of the center frequency. The factor $1/w$ introduces some nonlinearity on a steady offset basis, but this is very small in the usual applications where the center frequency is much higher than the frequency deviation. Furthermore, for symmetric modulation the sidebands combine in such a manner as to nullify this nonlinearity, that is, the upper and lower sidebands vary inversely so that their sum is essentially constant. All of the discriminator components are capable of wideband, instantaneous operation. It is well known to those versed in this art that the wider a discriminator is made the lower its sensitivity. In piror discriminators, balance is made at baseband. This sets the lower limit for the discriminator sensitivity in view of the difficulty of amplifying small d.c. signals. In the described discriminator, balance is made at the carrier frequency, permitting a.c. amplification of the small amplitudes that appear after balancing, thereby affording wideband operation.

RF cancellation is performed by the components enclosed within the broken lines identified by the letter Z. The output of the multiplier 15 is proportional to $\cos^2 wt$ and is applied to the summer 14. The output wave from the summer 13 is applied to the integrator 11 and the output of this integrator is fed to the multiplier 16. The input signal also is applied to the multiplier 16. Thus, the output of this multiplier is a wave proportional to $\sin^2 wt$ with the same proportionality factor. Since $\cos^2 wt + \sin^2 wt = 1$, the RF is fully cancelled instantaneously, introducing no delay. In prior FM detectors, the RF is attenuated by a lowpass filter which introduces a considerable delay.

For a modulated input wave, the RF cancellation is imperfect. However, for the usual applications, the level of RF cancellation is sufficient. Since the RF output of the described demodulator consists only of second harmonics of the input wave, RF filtering can be performed by a high-Q trap 17, with much less delay than the usual lowpass filter.

The described coherent FM detector has a better noise performance than the conventional limiter discriminator. All known FM detectors are capable of the same noise performance at very high signal-to-noise ratios (SNR). However, when the SNR is lowered, FM demodulators exhibit a threshold effect accompanied by threshold spikes which limits the noise immunity of frequency modulation. This threshold effect begins at a SNR of about 10 dB for the limiter discriminator and several dB lower for the phase-locked or frequency feedback loops. The reduction of the threshold level has been the subject of major research efforts in the last 15 years in connection with satellite, military and commercial FM communication. The herein described detector has no threshold spikes because of coherent detection and no limiting. Consequently the detector has a much lower threshold capability, and does not have the bandwidth or stability limitations of other currently known threshold reducing detectors. Related to the threshold reduction is the capability of the detector to reduce error rates in digital frequency shift keying systems, which is of great business importance in view of the rapid increase of this form of communication. The wideband capability of the detector also simplifies wideband binary FM demodulation.

Figure 2A:
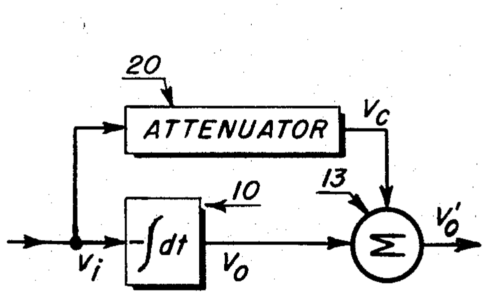
FIG. 2*a* is block diagram showing the arrangement for cancelling out the component in the output of a practical integrator which is not in phase quadrature with its input.
Figure 2B:
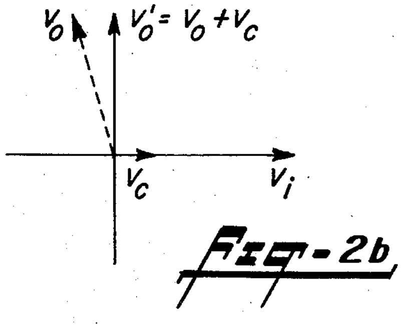
FIG. 2*b* is a corresponding phasor diagram.
Figure 3A:
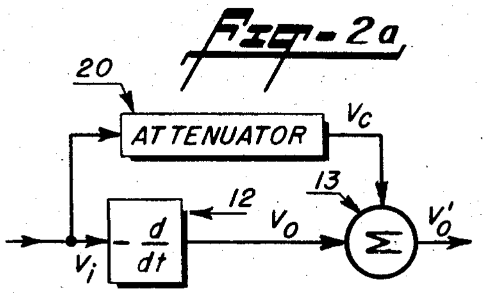
FIG. 3*a* is similar to FIG. 2a but showing the cancellation arrangement applied to a differentiator.
Figure 3B:
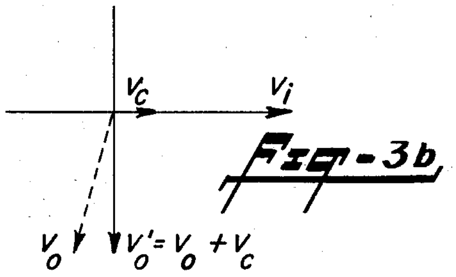
FIG. 3*b* is a corresponding phasor diagram.
Figure 4A:
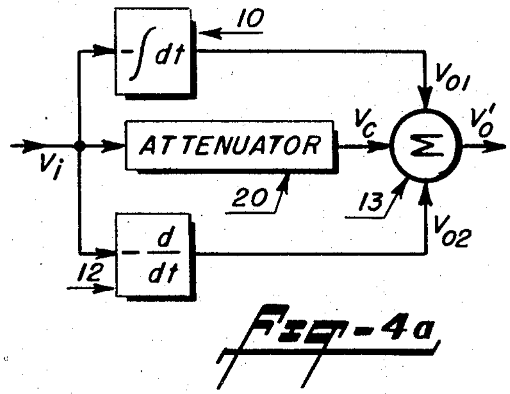
FIG. 4*a* is a block diagram showing the cancellation arrangement applied to an integrator-differentiator combination.
Figure 4B:
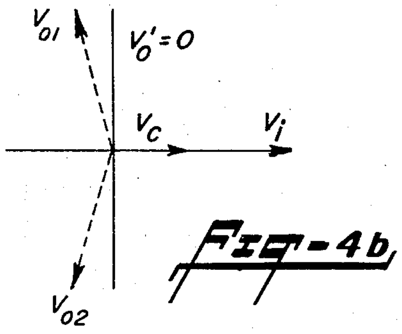
FIG. 4*b* is a corresponding phasor diagram.

Practical integrators and differentiators are imperfect due to their natural frequency limitations as well as by intentional design. The effect of this is a phase shift which is somewhat less than 90°, resulting in a quadrature component and a component which is collinear with the input. Since integrators and differentiators, using operational amplifiers, are signal inverters, their imperfections result in a voltage component which is 180° out of phase with the input voltage. In accordance with this invention, a simple method for cancelling the effect of such imperfections is to feed forward a small amount of the input voltage. FIG. 2*a* shows the integrator 10 receiving the signal voltage ($V_i$) and applying an output voltage ($V_o$) to the summer 13. A portion ($V_c$) of the input voltage is also applied directly to the summer 13 by means of the attenuator 20. Referring to the related phasor diagram of FIG. 2*b*, the attenuator is adjusted so that the voltage ($V_c$) cancels out the component of the integrator output voltage which is 180° out of phase with the input voltage. FIGS. 3*a* and 3*b* are similar representations showing the imperfection-cancellation method as used with the differentiator 12, and FIGS. 4*a* and 4*b* show the method as used with an integrator-differentiator combination. In each case, the cancellation is performed at $w_o$. In FIG. 4*a*, the adjustment is particularly easy because it is made for a null. If the imperfection is the same for both the integrator and differentiator, then as the signal deviates from the center frequency, the amplitudes of the integrator and differentiator change symmetrically, whereby the voltage component to be cancelled remains constant. The attenuator 20 is shown in FIG. 1 and provides a voltage component to the summer 13, said component having a magnitude and phase to cancel out the sum of the two voltage components arising by reason of the imperfections of the integrator 10 and the differentiator 12.

Appropriate imperfection-cancellation arrangements, shown in FIGS. 2*a*, 3*a* and 4*a*, are applied to the various embodiments of the FM detector disclosed herein. It is pointed out, however, that minor imperfections in the integrators and differentiators, which result in an imperfect null output of the summers, can be tolerated as they do not appreciably affect the operation of the various FM detectors.

Figures 5, 6, 7:
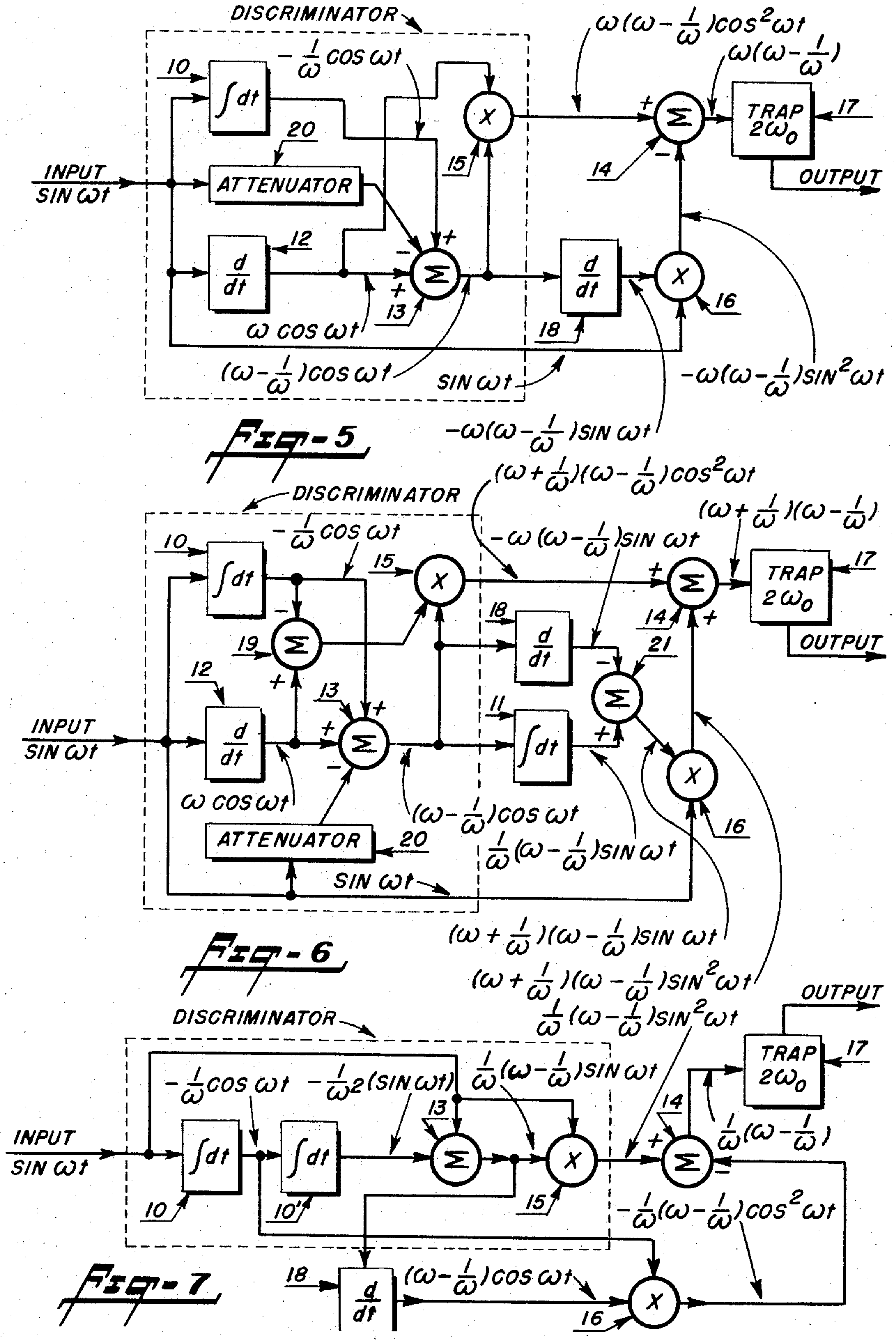
FIGS. 5, 6, 7 and 8 are block diagrams showing wideband coherent FM detectors made in accordance with other embodiments of this invention.

Reference now is made to FIG. 5 showing another ambodiment of the detector. In this case, an input to the multiplier 15 is taken from the differentiator 12 instead of from the integrator 10. Also, in the carrier cancellation portion of the circuit, the integrator 11 of FIG. 1 is replaced by the differentiator 18 in FIG. 5.

Another embodiment of the detector is shown in FIG. 6. In this case, the discriminator portion of the circuit includes a second summer 19 whose inputs are taken from the integrator 10 and the differentiator 12. The output of this summer is the difference between its two inputs, and this output is applied to the multiplier 15 instead of the output of the integrator 10 shown in FIG. 1. Similarly, in the carrier cancellation portion of the circuit, an additional summer 21 receives inputs from the integrator 11 and differentiator 18. The output of the summer 21 is the difference between its two inputs and this output is applied to the multiplier 16 instead of the output of the integrator 11 shown in FIG. 1. The FIG. 6 circuit has a more symmetrical response for frequency changes to either side of the center frequency of the input signal.

Referring to the embodiment of the invention shown in FIG. 7, the discriminator comprises two integrators 10 and 10′, the summer 13 and the multiplier 15. This discriminator de-emphasizes higher RF interference including harmonics of the carrier. However, it emphasizes 60Hz pick-ups and low frequency noise components.

A rapid change in input frequency may result in unequal areas for the positive and negative half-cycles adjacent to the freqeuncy changeover, even if the phase of the wave is continuous. Its effect is equivalent to that of a charge placed on the capacitor of the integrator. The result is an integrator output with a changing d.c. level, which disturbs the operation of the multiplier and is reflected in unwanted components at $w_o$ and baseband. This effect does not appear when modulation is smooth, or has been smoothed by narrowband filtering. It is also mitigated by the imperfection in the integrator.

Figure 8:
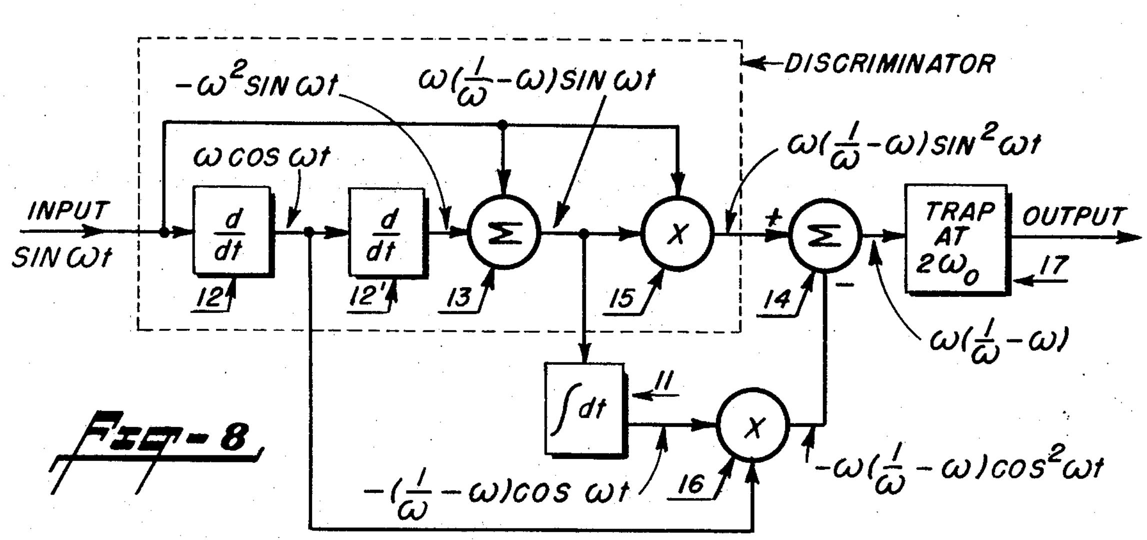

Reference now is made to FIG. 8, wherein the discriminator comprises a pair of differentiators 12 and 12′, a summer 13 and a multiplier 15. Having no integrators, this discriminator does not exhibit the effect mentioned above, which effect otherwise may arise upon a rapid change in the input frequency, producing unequal areas for the positive and negative half-cycles adjacent to the frequency changeover. The integrator 11, in the carrier cancellation portion of the circuit, does not exhibit this effect because its input (coming from the summer 13), has an amplitude that varies with frequency such that the areas of the half-cycles adjacent to the frequency changeover are equalized.

Figure 9:
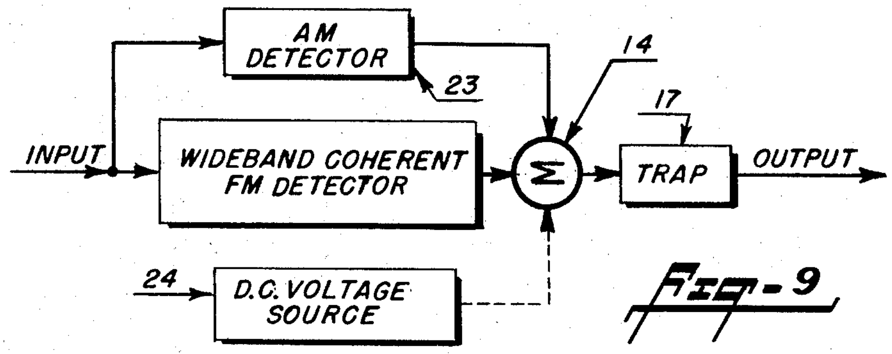
FIG. 9 is a block diagram representing a detector made in accordance with this invention and arranged for adjacent channel cancellation.

The detectors hereindescribed can be made to provide adjacent channel cancellation as shown in FIG. 9. In such case, the detector is made to have an RF null at the frequency of the adjacent channel, or other RF interferer, instead of at the signal center frequency. This feature, however, is obtained at the cost of unbalancing the operation at RF and requires a d.c. cancellation at the output. The required d.c. cancellation voltage can be obtained from the AM detector 23 or, alternatively, from an external source 24.

Figure 10:
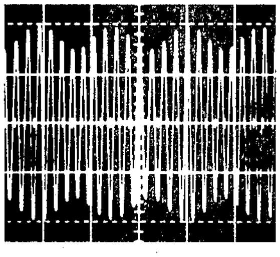
FIGS. 10–14 are actual waveforms at various points of the detector shown in FIG. 1.
Figure 11:
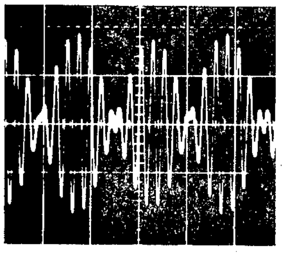
Figure 12:
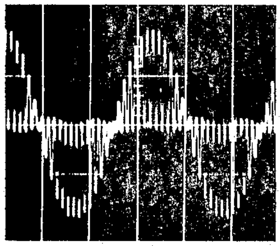
Figure 13:
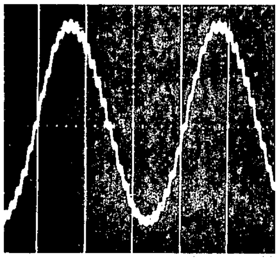
Figure 14:
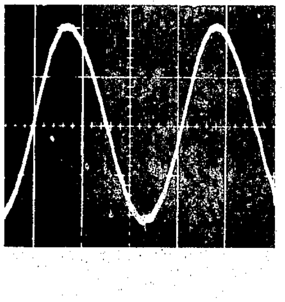

Actual waveforms at various points of the FIG. 1 detector are shown in FIGS. 10–14. It is here pointed out, however, that the input to the detector, FIG. 10, is from a narrow-band, predetection filter which introduces some amplitude modulation on the wave form. Such a filter is not, however, a basic requirement for the operation of the system.

Having described various embodiments of the invention, it will now be apparent that the discriminator portion of the apparatus comprises a network formed of various combinations of integrators and/or differentiators, which network receives the modulated carrier wave and produces two outputs which are substantially of opposite polarity and which have different amplitude Vs frequency responses. These outputs are applied to a summer producing a zero, or substantially zero, output at the center frequency of the modulated carrier wave. The output of the summer is applied to a coherent amplitude detector (multiplier) along with a signal derived from the said network, whereby the output of the amplitude detector is a wave containing the demodulated output and one or more RF components. In the case of a single RF component, namely, the second harmonic of the carrier, such component is cancelled out by a second network comprising a coherent amplitude detector, a summer, and a differentiator and/or integrator. The inputs to the latter coherent amplitude detector are such that they are in quadrature with the inputs to the coherent amplitude detector of the discriminator. The output of the coherent amplitude detector, in the said second network, is a wave which includes the second harmonic of the carrier having the same magnitude but opposite phase with respect to the second harmonic of the carrier wave appearing at the discriminator output. These two haromonics are cancelled by a summer which, at the same time, doubles the baseband output of the detector.

Each embodiment of the discriminator comprises a pair of phase-shifting circuits, namely, (a) an integrator and a differentiator, or, (b) two integrators, or, (c) two differentiators. Each phase-shifting circuit, if not ideal, will produce in its output an undesired component which is collinear with its input in addition to the desired component which is in quadrature with its input. This will cause the two outputs of the network not to be in phase oppostion with respect to each other. The undesired components can be cancelled simultaneously by feeding forward a part of the input of only one circuit to its output in such manner that the two outputs of the network will be 180° out of phase.

Referring to FIG. **15*a*, a portion of the input ($V_c$) is applied to the output of the integrator. The amplitude of this portion equals the algebraic sum of the components at the outputs of the integrator and differentiator which are not in quadrature with the input. FIG. 15*b* shows by phasor diagram the operation of this arrangement. It will be noted that the two outputs of the network are not necessarily in quadrature with the input. However, they are 180° out of phase with each other. An advantage of this arrangement over that of FIG. 4*a*, as applied to the discriminator of FIG. 1, is that the input to the coherent detector 15 normally obtained from the integrator output is now taken at the output of the second summer 13′, FIG. 15*a*. This provides the proper 0° and 180° phase relationship between the two inputs of the detector which is required for coherent detection. An alternative method of providing the appropriate phases at the two imputs of the coherent detector is to use the arrangement of FIG. 4***a* to phase one input to the detector and the arrangement of FIG. 2*a* for phasing the other input to said detector.

Figure 15A:
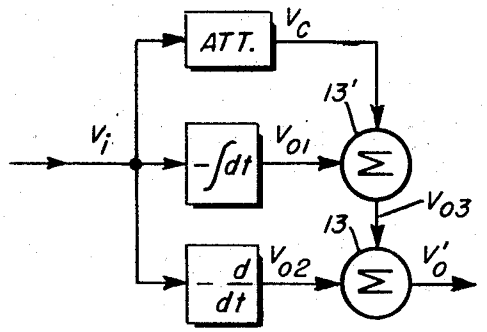
FIGS. 15*a* and 16*a* are block diagrams showing an arrangement for cancelling out the algebraic sum of the components in the outputs of an integrator-differentiator combination which are in quadrature with the desired output.
Figure 15B:
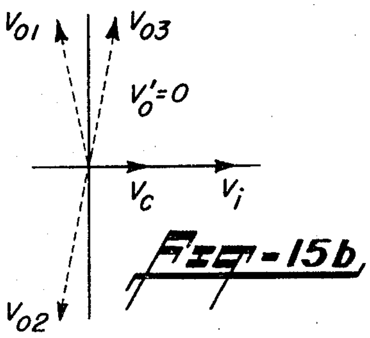
FIGS. 15*b* and 16*b* are corresponding phasor diagrams.
Figure 16A:
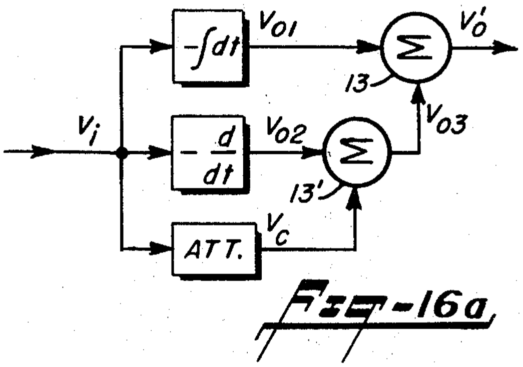
Figure 16B:
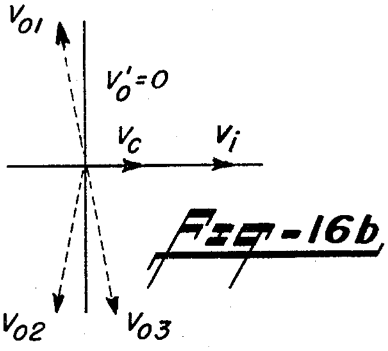

FIG. 16*a* shows an arrangement which operates on the same principle as FIG. 15*a* except that the feedforward path is around the differentiator. Both of these arrangements, FIGS. 15*a* and 16*a*, are equally applicable to the discriminators shown in FIGS. 1, 5 and 6.

Figure 17A:
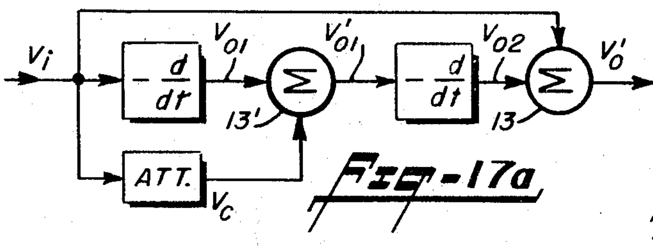
FIGS. 17*a*, 18*a*, and 19*a* are block diagrams showing an arrangement for cancelling out the component in the output of a tandem combination of differentiators or integrators which is in quadrature with the input.
Figure 17B:
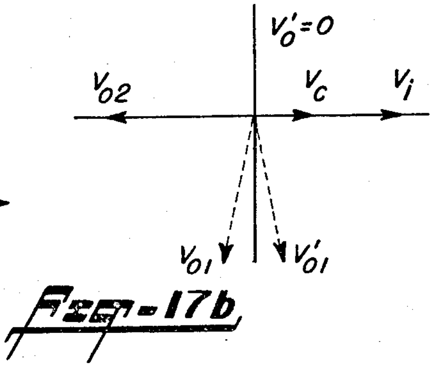
FIGS. 17*b*, 18*b*, and 19*b* are corresponding phasor diagrams.
Figure 18A:
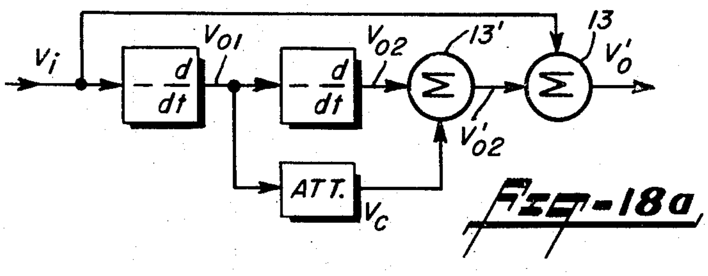
Figure 18B:
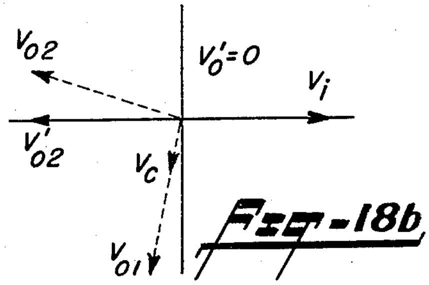
Figure 19A:
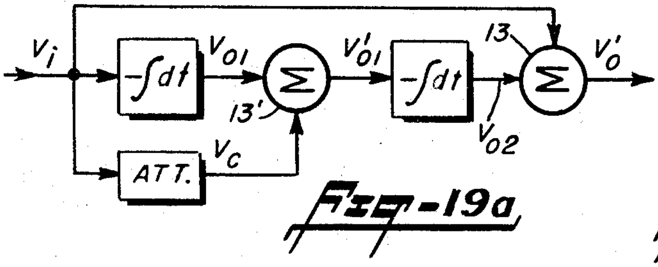
Figure 19B:
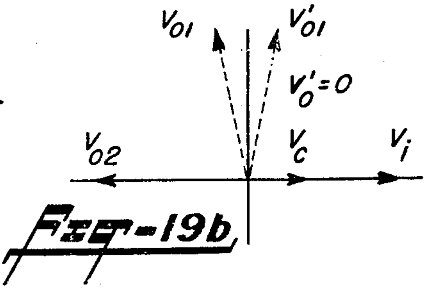

FIGS. 17*a*, 18*a*, and 19*a* are cancellation arrangements for the cases where the discriminator is comprised of two differentiators or two integrators. It is clear that the feedforward connection in the case of two integrators, FIG. 19*a*, can be made about the second integrator instead of about the first integrator, similar to the feedforward connection shown in FIG. 18*a*. The arrangements shown in FIGS. 17*a* and 18*a* are applicable to the discriminator shown in FIG. 8 while the arrangement shown in FIG. 19*a* is applicable to the FIG. 7 discriminator.

All of the herein-described detectors have no threshold spikes because they incorporate the feature of coherent detection and no amplitude limiting before discrimination.

Having now described the invention what we desire to protect by Letters Patent is set forth in the following claims.

We claim:

1. Apparatus for demodulating a frequency modulated carrier wave, which apparatus comprises, a. a first network comprising a first integrator receiving said wave and producing a first output and a first differentiator receiving said wave and producing a second output, the two outputs being of substantially opposite polarity and having different amplitude vs frequency responses which cross at a predetermined frequency, b. circuit elements applying the said two outputs to a first summer producing substantially a zero output at said predetermined frequency, c. a first coherent amplitude detector having two inputs, and d. circuit elements applying the output of said summer to one input of said detector, the other input to said detector being derived from the said first output, the output of said detector being the demodulated wave.

2. Apparatus as recited in claim 1, including a means adding to said first summer a portion of the input of said first network, which portion is 180° out of phase with and equal in amplitude to the algebraic sum of the components of the said two outputs which are collinear with the input to said first network.

3. Apparatus as recited in claim 1, including a second network comprising a second integrator, a second coherent amplitude detector and a second summer, said second integrator receiving a signal derived from the said first summer, said second detector receiving one input derived from said second integrator and a second input derived from the input to said first network, and said second summer receiving a first input derived from said second detector and a second input derived from said first detector, the output of said second summer being the difference between its two inputs.

4. Apparatus as recited in claim 3, including means applying to the said first summer a portion of the input of said first network, which portion is 180° out of phase with and equal in amplitude to the algebraic sum of the components of the said two outputs which are collinear with the input to said first network.

5. Apparatus as recited in claim 4, including means adding a portion of the input of said second integrator to its output, which portion is 180° out of phase with and equal in amplitude to the component of the output of said second integrator which is collinear with its input.

6. Apparatus as recited in claim 1, including means adding a portion of the input of said first integrator to its output, which portion is 180° out of phase with and equal in amplitude to the algebraic sum of the components of the outputs of said first integrator and first differentiator which are collinear with the input to said first network.

7. Apparatus as recited in claim 1, including means adding a portion of the input of said first differentiator to its output, which portion is 180° out of phase with and equal in amplitude to the algebraic sum of the components of the outputs of said first integrator and first differentiator which are collinear with the input to said first network.

8. Apparatus as recited in claim 1, wherein the said predetermined frequency is different from the center frequency of the modulated carrier wave resulting in a d.c. component in the output of said first detector; and including a second summer having two inputs, the first input to said second summer being the output of the said first detector and the second input to said second summer being a d.c. voltage having a polarity and magnitude to substantially cancel the said d.c. component.

* * * * *